(12) United States Patent
Kuribayashi

(10) Patent No.: US 11,858,131 B2
(45) Date of Patent: Jan. 2, 2024

(54) TEACHING METHOD FOR INDUSTRIAL ROBOT

(71) Applicant: NIDEC SANKYO CORPORATION, Nagano (JP)

(72) Inventor: Tamotsu Kuribayashi, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 165 days.

(21) Appl. No.: 17/520,721

(22) Filed: Nov. 8, 2021

(65) Prior Publication Data

US 2022/0143809 A1 May 12, 2022

(30) Foreign Application Priority Data

Nov. 9, 2020 (JP) ................................. 2020-186269

(51) Int. Cl.
*B25J 9/00* (2006.01)
*B25J 9/16* (2006.01)
(Continued)

(52) U.S. Cl.
CPC ........... *B25J 9/0081* (2013.01); *B25J 9/0009* (2013.01); *B25J 9/1687* (2013.01); *H01L 21/68* (2013.01);
(Continued)

(58) Field of Classification Search
CPC ........ B25J 9/009; B25J 9/0081; B25J 9/1687; B25J 11/0095; B25J 15/009;
(Continued)

(56) References Cited

U.S. PATENT DOCUMENTS 7,105,847 B2   9/2006   Oka
10,395,956 B2   8/2019   Yoshida et al.
(Continued)

FOREIGN PATENT DOCUMENTS

CN   1692487   11/2005
CN   101318325   12/2008
(Continued)

OTHER PUBLICATIONS

"Office Action of China Counterpart Application", dated Apr. 15, 2023, with English translation thereof, pp. 1-15.

*Primary Examiner* — Dale Moyer
(74) *Attorney, Agent, or Firm* — JCIPRNET

(57) ABSTRACT

In a teaching method for an industrial robot having a hand on which a conveyance object is to be mounted, the teaching method includes a positioning member attaching step in which a positioning member for determining a position of a conveyance object to be mounted on the hand in a horizontal direction is attached to an upper face side of the hand and, after that, a teaching step in which the hand is moved to a predetermined position to perform teaching for the industrial robot, and after that, a positioning member detaching step in which the positioning member is detached from the hand. When the conveyance object is mounted on the hand in a state that an end face of the conveyance object is contacted with the positioning member, the conveyance object is disposed at a normal mounting position on the hand.

2 Claims, 4 Drawing Sheets

(51) Int. Cl.
*H01L 21/68* (2006.01)
*H01L 21/687* (2006.01)

(52) U.S. Cl.
CPC ............. *H01L 21/68707* (2013.01); *G05B 2219/45031* (2013.01)

(58) Field of Classification Search
CPC .... G05B 2219/45031; H01L 21/67766; H01L 21/68; H01L 21/68707
See application file for complete search history.

(56) References Cited

U.S. PATENT DOCUMENTS

| | | | |
|---|---|---|---|
| 2006/0113806 A1* | 6/2006 | Tsuji | H01L 21/68707 294/213 |
| 2012/0116586 A1 | 5/2012 | Fujii | |
| 2014/0222202 A1* | 8/2014 | Yoshida | H01L 21/68 700/258 |
| 2018/0218935 A1* | 8/2018 | Kuwahara | H01L 21/68 |

FOREIGN PATENT DOCUMENTS

| | | |
|---|---|---|
| CN | 102272898 | 12/2011 |
| CN | 102448682 | 5/2012 |
| CN | 102985231 | 3/2013 |
| CN | 108780770 | 11/2018 |
| CN | 109866208 | 6/2019 |
| CN | 110666838 | 1/2020 |
| CN | 110668188 | 1/2020 |
| JP | 2017119326 | 7/2017 |
| KR | 20190099139 | 8/2019 |

* cited by examiner

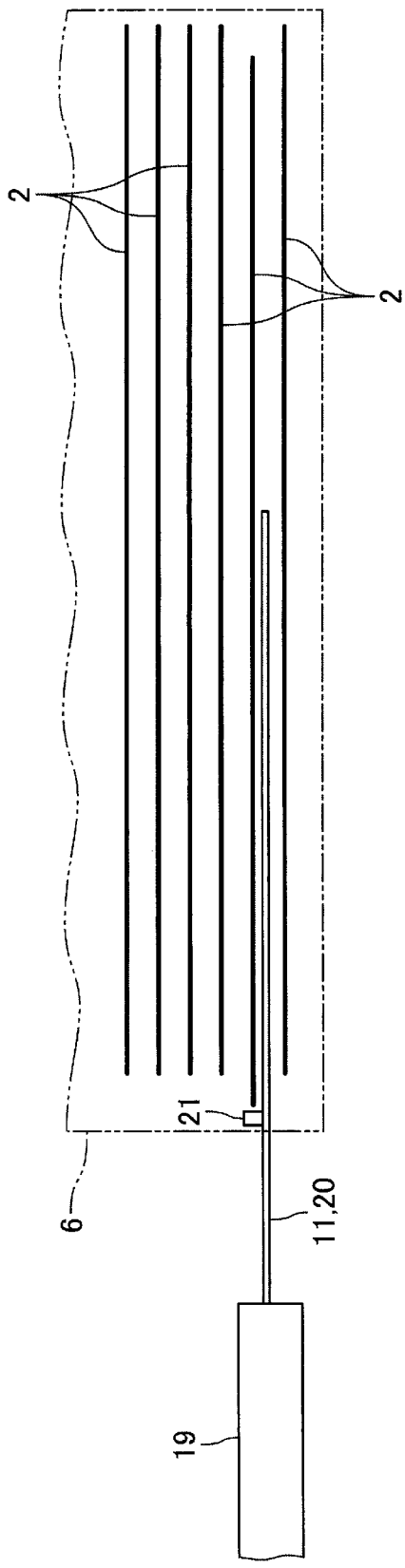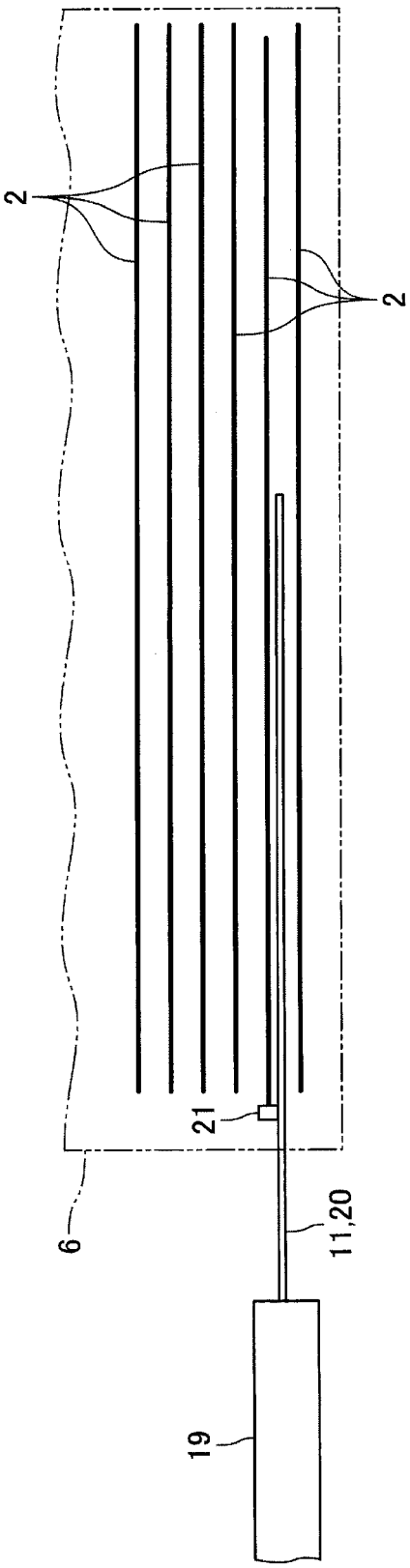
FIG. 3A
FIG. 3B

TEACHING METHOD FOR INDUSTRIAL ROBOT

CROSS REFERENCE TO RELATED APPLICATION

The application claims priority under 35 U.S.C. § 119 to Japanese Application No. 2020-186269, filed Nov. 9, 2020, the entire content of which is incorporated herein by reference.

BACKGROUND

Technical Field

At least an embodiment of the present invention may relate to a teaching method for an industrial robot which includes a hand on which a conveyance object is mounted.

Description of Related Art

Conventionally, a horizontal multi joint type industrial robot for conveying a semiconductor wafer has been known (see, for example, Japanese Patent Application Laid-Open No. 2017-119326 (Patent Literature 1)). The industrial robot described in Patent Literature 1 includes four hands on each of which a semiconductor wafer 2 is mounted, an arm with which four hands are turnably connected, and a main body part with which a base end side of the arm is turnably connected. Each of the four hands is provided with a holding part which holds a semiconductor wafer. Specifically, two of the four hands are provided with an edge grip type holding part and remaining two hands are provided with a suction type holding part.

In the industrial robot described in Patent Literature 1, the edge grip type holding part is provided with an end face abutting member having an abutting face with which an end face of a semiconductor wafer is abutted, and a pressing mechanism which presses the semiconductor wafer so that the end face of the semiconductor wafer is pressed against the abutting face of the end face abutting member. Further, the suction type holding part is formed with a suction hole for sucking a semiconductor wafer. As a hand of an industrial robot for conveying a semiconductor wafer, a hand may be used which is provided with no holding part for a semiconductor wafer. The hand is, for example, attached with a support member which supports a semiconductor wafer from a lower side. In this hand, the semiconductor wafer is merely placed on the support member, and the semiconductor wafer mounted on the hand is not held by the hand.

When teaching for an industrial robot structured to convey a semiconductor wafer like an industrial robot described in Patent Literature 1 is to be performed, for example, a hand is sometimes required to be moved to a predetermined position in a state that a semiconductor wafer has been mounted on the hand. In a case that a hand of an industrial robot is provided with an edge grip type holding part, the hand is capable of mounting a semiconductor wafer so that the semiconductor wafer is disposed at a normal mounting position on the hand by using an end face abutting member and a pressing mechanism. Therefore, teaching for an industrial robot can be performed by moving a hand on which a semiconductor wafer disposed at a normal mounting position has been mounted to a predetermined position. Accordingly, teaching for the industrial robot can be performed with a high degree of accuracy.

On the other hand, in a case that a holding part provided in a hand is a suction type holding part or, in a case that a hand is provided with no holding part, a position in a horizontal direction of a semiconductor wafer mounted on the hand is not determined accurately and thus, it is difficult to mount a semiconductor wafer on the hand so that the semiconductor wafer is disposed at a normal mounting position on the hand. Therefore, in this case, it may be difficult to perform teaching for the industrial robot with a high degree of accuracy. Further, even in a case that a holding part provided in a hand is a suction type holding part or, even in a case that a hand is provided with no holding part, for example, it is possible that a mounting position of a semiconductor wafer on a hand is finely adjusted so that the semiconductor wafer is disposed at a normal mounting position on the hand. However, in this case, much time is required.

SUMMARY

At least an embodiment of the present invention may advantageously provide a teaching method for an industrial robot having a hand on which a conveyance object is to be mounted; even if the hand is not provided with an edge grip type holding part, when teaching for the industrial robot is to be performed, the teaching method is capable of mounting a conveyance object on a hand in a short time, so that the conveyance object is disposed at a normal mounting position on the hand.

According to at least an embodiment of the present invention, there may be provided a teaching method for an industrial robot including a hand on which a conveyance object is to be mounted. The teaching method includes a positioning member attaching step in which a positioning member for determining a position of the conveyance object to be mounted on the hand in a horizontal direction is attached to an upper face side of the hand and, after that, a teaching step in which the hand is moved to a predetermined position to perform teaching for the industrial robot and, after that, a positioning member detaching step in which the positioning member is detached from the hand. When the conveyance object is mounted on the hand in a state that an end face of the conveyance object is contacted with the positioning member, the conveyance object is disposed at a normal mounting position on the hand.

In the teaching method for an industrial robot in accordance with at least an embodiment of the present invention, in a positioning member attaching step before a teaching step in which a hand is moved to a predetermined position and teaching for the industrial robot is performed, a positioning member for determining a position in a horizontal direction of a conveyance object to be mounted on the hand is attached to the hand. Further, in an embodiment of the present invention, when a conveyance object is mounted on the hand in a state that an end face of the conveyance object is contacted with the positioning member, the conveyance object is disposed at a normal mounting position on the hand. Therefore, according to an embodiment of the present invention, even if the hand is not provided with an edge grip type holding part, since a conveyance object is mounted on the hand so that an end face of the conveyance object is contacted with the positioning member, the conveyance object can be mounted on the hand in a short time so that the conveyance object is disposed at the normal mounting position on the hand when teaching for the industrial robot is to be performed.

In an embodiment of the present invention, for example, the conveyance object is formed in a circular plate shape and, in the positioning member attaching step, two pieces of the positioning member are attached to the upper face side of the hand.

In an embodiment of the present invention, the industrial robot is structured at least to carry out the conveyance object from an accommodation part where the conveyance object is accommodated, the hand is provided with a protruded part in a pin shape which is contacted with a front end face of the conveyance object to correct a position of the conveyance object to be mounted on the hand when the conveyance object accommodated on a front side with respect to a normal accommodated position is to be carried out from the accommodation part at a time of actual use of the industrial robot, the positioning member is formed in a ring shape and, in the positioning member attaching step, an inner peripheral side of the positioning member is fitted to the protruded part and thereby the positioning member is attached to the upper face side of the hand.

According to this structure, a positioning member can be attached by using a protruded part for correcting a position of a conveyance object at a time of actual use of the industrial robot and thus, another member for attaching a positioning member is not required to separately provide in the hand. Therefore, a structure of the hand can be simplified and a cost of the hand can be reduced. Further, according to this structure, the positioning member can be attached to an upper face side of the hand by fitting an inner peripheral side of the positioning member to the protruded part and thus, the positioning member can be easily attached to and detached from the hand in a short time.

As described above, in one or more embodiments of the present invention, in the teaching method for an industrial robot having a hand on which a conveyance object is mounted, even if the hand is not provided with an edge grip type holding part, when teaching for the industrial robot is to be performed, the conveyance object can be mounted on the hand in a short time so that the conveyance object is disposed at a normal mounting position on the hand.

Other features of the invention will be apparent from the following detailed description, taken in conjunction with the accompanying drawings that illustrate, by way of example, various features of embodiments of the invention.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 3A and 3B are explanatory side views showing a structure of the hand shown in FIG. 1.

DETAILED DESCRIPTION

An embodiment of the present invention will be described below with reference to the accompanying drawings.

Schematic Structure of Industrial Robot

Figure 1:
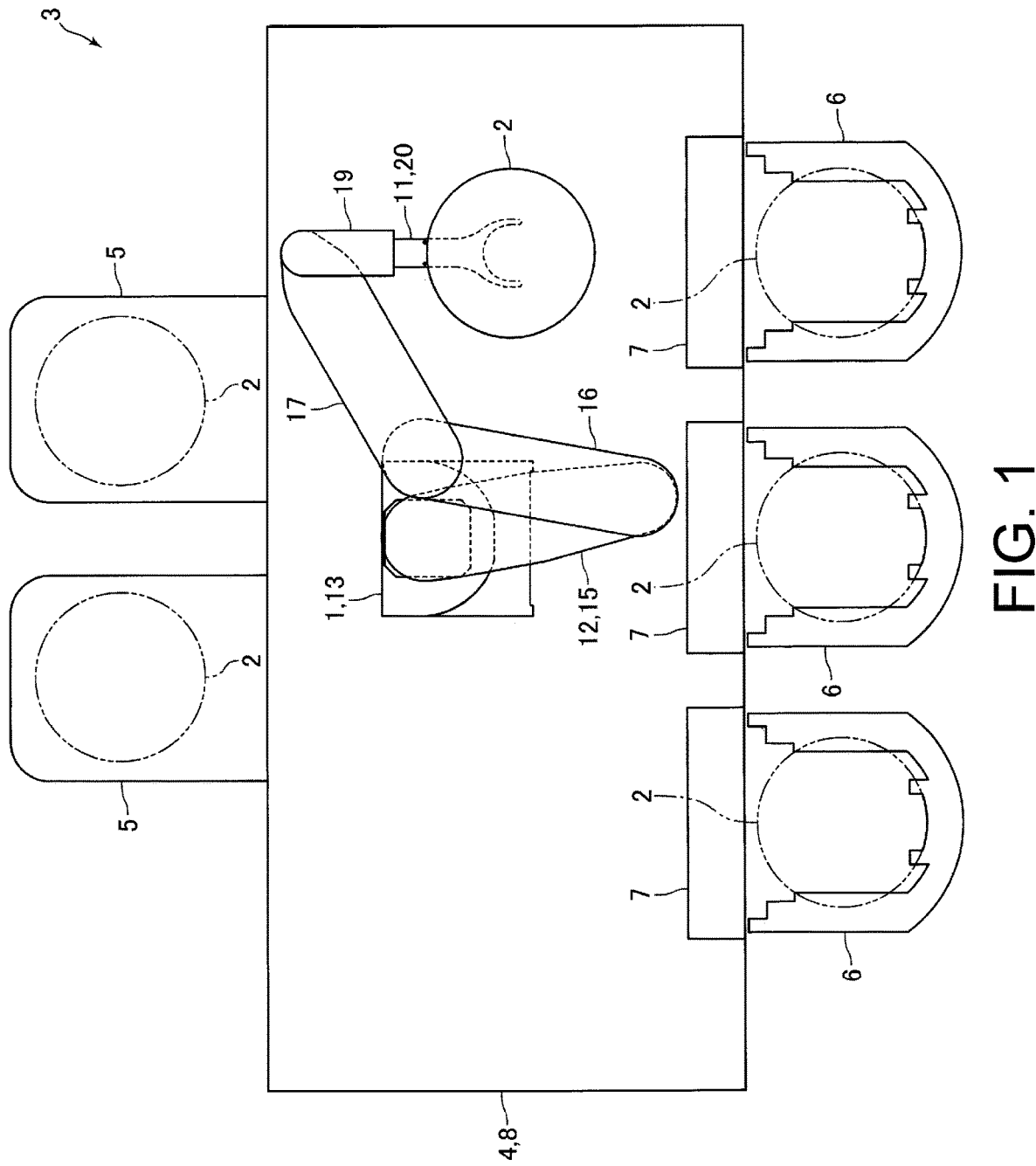
FIG. 1 is an explanatory plan view showing a schematic structure of an industrial robot on which teaching is performed by a teaching method for an industrial robot in accordance with an embodiment of the present invention.
Figure 2:
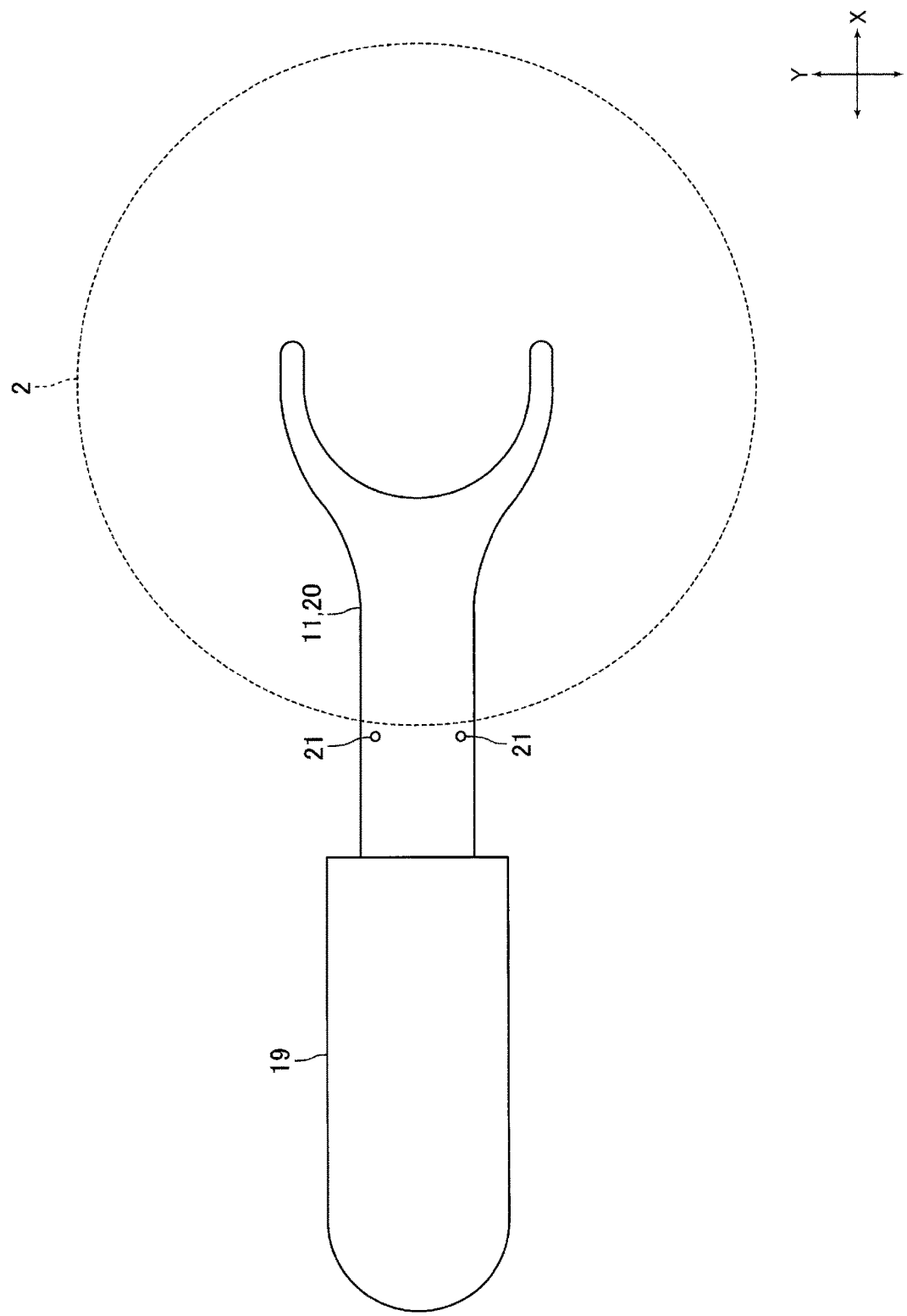
FIG. 2 is a plan view showing the hand in FIG. 1.

FIG. 1 is an explanatory plan view showing a schematic structure of an industrial robot 1 on which teaching is performed by a teaching method for an industrial robot in accordance with an embodiment of the present invention. FIG. 2 is a plan view showing the hand 11 in FIG. 1. FIGS. 3A and 3B are explanatory side views showing a structure of the hand 11 shown in FIG. 1.

An industrial robot 1 on which teaching is performed by a teaching method for an industrial robot in this embodiment is a horizontal multi joint type robot for conveying a semiconductor wafer 2 which is a conveyance object. The semiconductor wafer 2 is formed in a thin circular plate shape. The industrial robot 1 is incorporated and used in a semiconductor manufacturing system 3. In the following descriptions, the industrial robot 1 is referred to as a "robot 1", and the semiconductor wafer 2 is referred to as a "wafer 2".

The semiconductor manufacturing system 3 includes, for example, an EFEM (Equipment Front End Module) 4 and wafer processing apparatuses 5 for performing predetermined processing on a wafer 2. The robot 1 structures a part of the EFEM 4. Further, the EFEM 4 includes, for example, a plurality of load ports 7 for opening and closing an FOUP (Front Open Unified Pod) 6 in which wafers 2 are accommodated, and a housing 8 in which the robot 1 is accommodated.

The FOUP 6 is capable of accommodating a plurality of wafers 2 in a state that they are separated from each other at a constant interval in an upper and lower direction and, in addition, in a state that they are overlapped with each other in the upper and lower direction. The robot 1 conveys a wafer 2 between the FOUP 6 and the wafer processing apparatus 5. For example, the robot 1 carries out a wafer 2 from the FOUP 6, and the wafer 2 having been carried out is carried into the wafer processing apparatus 5. Further, the robot 1 carries out the wafer 2 from the wafer processing apparatus 5, and the wafer 2 having been carried out is carried into the FOUP 6. The FOUP 6 in this embodiment is an accommodation part in which a wafer 2 that is a conveyance object is accommodated.

The robot 1 includes a hand 11 on which a wafer 2 is mounted, an arm 12 whose tip end side is turnably connected with the hand 11 and which is operated in a horizontal direction, and a main body part 13 with which a base end side of the arm 12 is turnably connected. The arm 12 is structured of a first arm part 15 whose base end side is turnably connected with the main body part 13, a second arm part 16 whose base end side is turnably connected with a tip end side of the first arm part 15, and a third arm part 17 whose base end side is turnably connected with a tip end side of the second arm part 16.

The main body part 13, the first arm part 15, the second arm part 16 and the third arm part 17 are disposed in this order from a lower side in the upper and lower direction. The main body part 13 includes a lifting mechanism structured to lift and lower the arm 12. Further, the robot 1 includes an arm part drive mechanism structured to turn the first arm part 15 and the second arm part 16 to extend and contract a part of the arm 12 comprised of the first arm part 15 and the second arm part 16, a third arm part drive mechanism structured to turn the third arm part 17, and a hand drive mechanism structured to turn the hand 11.

The hand 11 is formed in a substantially "Y"-shape when viewed in the upper and lower direction. The hand 11 is provided with a connecting part 19 which is connected with a tip end side of the third arm part 17 and a wafer mounting part 20 on which a wafer 2 is mounted. The hand 11 is disposed on an upper side of the third arm part 17. The wafer mounting part 20 is formed in a flat plate shape and a wafer 2 is mounted on an upper face of the wafer mounting part 20. An upper face of the wafer mounting part 20 is formed with a suction hole (not shown) for sucking and holding the wafer 2. In other words, the hand 11 is provided with a suction type holding part for holding the wafer 2 mounted on the wafer mounting part 20. The hand 11 is not provided with a positioning mechanism, which is structured to position the wafer 2 in a horizontal direction so that the wafer 2 is mounted at a normal mounting position of the wafer mounting part 20.

The hand 11 is provided with a protruded part 21 in a pin shape which is fixed to the wafer mounting part 20. In this embodiment, two protruded parts 21 are fixed to the wafer mounting part 20. The protruded part 21 is formed in a columnar shape. The protruded part 21 is protruded from an upper face of the wafer mounting part 20 to an upper side. A length of the protruded part 21 (length in the upper and lower direction) is set to be longer than a thickness of the wafer 2. The protruded part 21 is fixed to a base end side (connecting part 19 side) of the wafer mounting part 20. The two protruded parts 21 are disposed at the same position as each other in a longitudinal direction ("X" direction in FIG. 2) of the hand 11 whose shape is a substantially "Y"-shape when viewed in the upper and lower direction and, in addition, the two protruded parts 21 are disposed in a separated state from each other in a direction ("Y" direction in FIG. 2) perpendicular to the longitudinal direction of the hand 11 and the upper and lower direction. Further, the protruded parts 21 are disposed at positions where the protruded parts 21 are not contacted with the wafer 2 mounted at a normal mounting position of the wafer mounting part 20.

In a case that a wafer 2 is accommodated on a front side with respect to the normal accommodated position in the FOUP 6 and the wafer 2 is displaced to a front side with respect to the normal accommodated position (see FIG. 3A), the protruded parts 21 function to contact with a front end face of the wafer 2 and correct a position of the wafer 2 to be mounted on the hand 11 before the wafer 2 displaced to the front side is mounted on the hand 11 (see FIG. 3B). In other words, when a wafer 2 accommodated to a front side with respect to the normal accommodated position is to be carried out from the FOUP 6 at a time of actual use of the robot 1, the protruded parts 21 contact with a front end face of the wafer 2 and correct the position of the wafer 2 to be mounted on the hand 11.

Specifically, in a case that a wafer 2 has been displaced to a front side from the normal accommodated position in the FOUP 6, the protruded part 21 contacts with a front end face of the wafer 2 to correct the position of the wafer 2 so that the wafer 2 is mounted on the wafer mounting part 20 within a predetermined allowable range with respect to the wafer mounting part 20. Further, in a case that a wafer 2 has been displaced to a front side from the normal accommodated position in the FOUP 6, the wafer 2 is mounted on the hand 11 after the position of the wafer 2 is corrected by the protruded part 21.

In this embodiment, the FOUP 6 includes a restriction member which restricts a position of a wafer 2 accommodated in the FOUP 6 on a rear side of the FOUP 6 and thus, the wafer 2 is not displaced to a rear side from the normal accommodated position in the FOUP 6. However, the wafer 2 may be displaced to a front side from the normal accommodated position in the FOUP 6 due to vibrations when the FOUP 6 is opened by the load port 7 and the like.

Teaching Method for Industrial Robot

Figure 4:
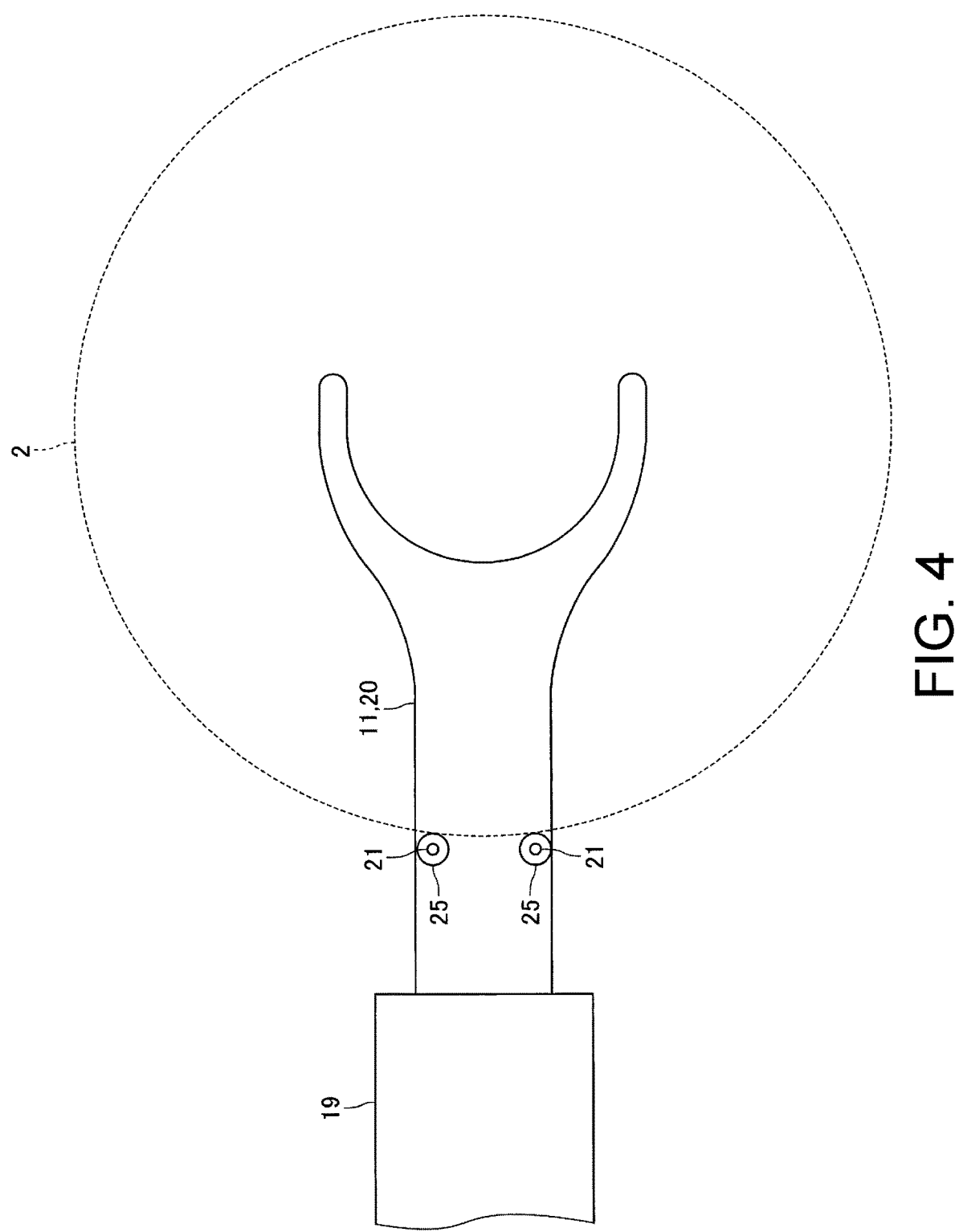
FIG. 4 is an explanatory plan view showing a structure of a positioning member which is used when teaching for the industrial robot shown in FIG. 1 is performed.

FIG. 4 is an explanatory plan view showing a structure of a positioning member 25 which is used when teaching for the robot 1 shown in FIG. 1 is performed.

When teaching for the robot 1 is to be performed, a positioning member 25 is used for positioning a wafer 2 to be mounted on the hand 11 in the horizontal direction. The positioning member 25 is formed in a ring shape. Specifically, the positioning member 25 is formed in a circular ring shape. Further, the positioning member 25 is formed in a cylindrical tube shape whose length in an axial direction is short and which is flat and thick. The positioning member 25 is attached to an upper face side of the hand 11. Specifically, the positioning member 25 is attached to the protruded part 21 by fitting an inner peripheral side of the positioning member 25 to the protruded part 21.

In other words, the positioning member 25 is attached to an upper face side of the wafer mounting part 20. Further, two positioning members 25 are attached to the upper face side of the wafer mounting part 20. A length in the axial direction (length in the upper and lower direction) of the positioning member 25 is set to be substantially equal to a length in the upper and lower direction of the protruded part 21 and is larger than a thickness of the wafer 2. In this embodiment, when a wafer 2 is mounted on the wafer mounting part 20 in a state that an end face of the wafer 2 is contacted with the two positioning members 25 (in other words, when a wafer 2 is mounted on the hand 11 in a state that an end face of the wafer 2 is contacted with the two positioning members 25), the wafer 2 is disposed at a normal mounting position on the hand 11 (see FIG. 4).

The teaching method for the robot 1 in this embodiment includes a positioning member attaching step in which the positioning member 25 is attached to the upper face side of the hand 11 and, after that, a teaching step in which the hand 11 is moved to a predetermined position and teaching for the robot 1 is performed and, after that, a positioning member detaching step in which the positioning member 25 is detached from the hand 11. In the positioning member attaching step, two positioning members 25 are attached to the upper face side of the hand 11. Further, in the positioning member attaching step, an inner peripheral side of the positioning member 25 is fitted to the protruded part 21 and thereby, the positioning member 25 is attached to the upper face side of the hand 11. In the positioning member detaching step, the two positioning members 25 are detached from the upper face side of the hand 11.

In the teaching step, for example, in a state that the wafer 2 has been mounted on the hand 11 so that an end face of the wafer 2 is contacted with the two positioning members 25, the hand 11 is moved to a position where the wafer 2 is placed at a normal position in an inside of the wafer processing apparatus 5 to teach a position of the hand 11 in the wafer processing apparatus 5. Further, in the teaching step, for example, in a state that the wafer 2 has been mounted on the hand 11 so that an end face of the wafer 2 is contacted with the two positioning members 25, the hand 11 is moved to a position where the wafer 2 is placed at a normal accommodated position in an inside of the FOUP 6 to teach a position of the hand 11 in the FOUP 6.

In this case, for example, in a state that a wafer 2 is mounted on the hand 11 so that an end face of the wafer 2 is contacted with the two positioning members 25, the hand 11 is moved to the wafer processing apparatus 5 or the FOUP 6 and the wafer 2 is placed in an inside of the wafer processing apparatus 5 or in an inside of the FOUP 6 and then, a deviation amount between a position of the wafer 2 having been placed and a normal position for the wafer 2 in an inside of the wafer processing apparatus 5 or the FOUP 6 is calculated and then, while correcting the position of the hand 11, finally, the hand 11 is moved to a position where the wafer 2 is placed at the normal position in the inside of the wafer processing apparatus 5 or the FOUP 6.

Further, in the teaching step, for example, the hand 11 in a state that no wafer 2 has been mounted is moved to a position where a wafer 2 disposed at a normal position in an inside of the wafer processing apparatus 5 is contacted with two positioning members 25 to teach a position of the hand 11 in the wafer processing apparatus 5. Further, in the teaching step, for example, the hand 11 in a state that no wafer 2 has been mounted is moved to a position where a wafer 2 disposed at a normal position in an inside of the FOUP 6 is contacted with two positioning members 25 to teach a position of the hand 11 in the FOUP 6.

In this case, for example, a hand 11 in a state that no wafer 2 has been mounted is moved to the wafer processing apparatus 5 or the FOUP 6 and, after a wafer 2 having been disposed at the normal position in an inside of the wafer processing apparatus 5 or the FOUP 6 is mounted on the hand 11, a deviation amount between an end face of the wafer 2 having been mounted and the two positioning members 25 is calculated and then, while correcting the position of the hand 11, finally, the hand 11 in a state that no wafer 2 has been mounted is moved to the position where the wafer 2 disposed at the normal position in the inside of the wafer processing apparatus 5 or the FOUP 6 is contacted with the two positioning members 25.

Principal Effects in this Embodiment

As described above, in this embodiment, in the positioning member attaching step before the teaching step, the positioning member 25 is attached to the hand 11. Further, in this embodiment, when a wafer 2 is mounted on the hand 11 in a state that an end face of the wafer 2 is contacted with the positioning member 25, the wafer 2 is disposed at the normal mounting position on the hand 11. Therefore, in this embodiment, even in a case that the hand 11 is not provided with an edge grip type holding part, since a wafer 2 is mounted on the hand 11 so that an end face of the wafer 2 is contacted with the positioning member 25, when teaching for the robot 1 is to be performed, the wafer 2 can be mounted on the hand 11 in a short time so that the wafer 2 is disposed at the normal mounting position on the hand 11.

In this embodiment, the positioning member 25 is attached to the protruded part 21 by fitting an inner peripheral side of the positioning member 25 to the protruded part 21. In other words, in this embodiment, the positioning member 25 is attached to an upper face side of the hand 11 by using the protruded part 21 which corrects the position of the wafer 2 at a time of actual use of the robot 1. Therefore, in this embodiment, it is not required to separately provide a member for attaching the positioning member 25 to the hand 11. Accordingly, in this embodiment, a structure of the hand 11 is simplified and a cost of the hand 11 can be reduced.

Further, in this embodiment, when an inner peripheral side of the positioning member 25 is fitted to the protruded part 21, the positioning member 25 can be attached to the upper face side of the hand 11 and thus, the positioning member 25 can be easily attached to and detached from the hand 11 in a short time. Further, in this embodiment, the protruded part 21 is formed in a columnar shape and thus, the protruded part 21 can be easily manufactured and the positioning member 25 can be easily manufactured.

Other Embodiments

Although the present invention has been shown and described with reference to a specific embodiment, various changes and modifications will be apparent to those skilled in the art from the teachings herein.

In the embodiment described above, the protruded part 21 may be formed in a polygonal prism shape such as a quadrangular prism shape. In this case, an inner peripheral face of the positioning member 25 is formed in a polygonal prism face shape corresponding to a shape of the protruded part 21. Further, in the embodiment described above, the positioning member 25 may be attached to a member other than the protruded part 21. In other words, the hand 11 may be provided with a member for attaching the positioning member 25 in addition to the protruded part 21. In this case, the positioning member 25 is not required to be formed in a ring shape.

In the embodiment described above, when a position in a horizontal direction of a wafer 2 mounted on the hand 11 can be determined, the number of a positioning member attached to the upper face side of the hand 11 may be one. In this case, contact parts which are contacted with a wafer 2 in two directions are formed in the positioning member. Further, in the embodiment described above, when a position in a horizontal direction of a wafer 2 mounted on the hand 11 can be determined, the number of a positioning member attached to an upper face side of the hand 11 may be three or more.

In the embodiment described above, the hand 11 may be provided with no holding part for holding a wafer 2 which is mounted on the wafer mounting part 20. In this case, for example, a support member which supports a wafer 2 from a lower side is attached to an upper face side of the hand 11. The support member is, for example, formed of rubber. In this hand 11, a wafer 2 is merely placed on the support member, and the wafer 2 mounted on the hand 11 is not held by the hand 11. Further, in this hand 11, a wafer 2 mounted on the hand 11 is not positioned in a horizontal direction.

In the embodiment described above, the robot 1 may be provided with two hands 11 which are turnably connected with a tip end side of the arm 12. Further, in the embodiment described above, the arm 12 may be structured of two arm parts and may be structured of four or more arm parts. Further, in the embodiment described above, a conveyance object which is to be conveyed by the robot 1 may be an object other than a wafer 2. In this case, for example, a conveyance object may be formed in a square or a rectangular flat plate shape. In addition, an industrial robot to which one or more of the embodiments of the present invention are applied may be a robot other than a horizontal multi joint type industrial robot. For example, an industrial robot to which one or more of the embodiments of the present invention are applied may be an industrial robot having a linear drive part structured to linearly reciprocate the hand 11.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A teaching method for an industrial robot comprising a hand on which a conveyance object is to be mounted, the teaching method comprising:

a positioning member attaching step in which a positioning member for determining a position of the conveyance object to be mounted on the hand in a horizontal direction is attached to an upper face side of the hand;

after that, a teaching step in which the hand is moved to a predetermined position to perform teaching for the industrial robot; and after that, a positioning member detaching step in which the positioning member is detached from the hand;

wherein when the conveyance object is mounted on the hand in a state that an end face of the conveyance object is contacted with the positioning member, the conveyance object is disposed at a normal mounting position on the hand, wherein the industrial robot is structured at least to carry out the conveyance object from an accommodation part where the conveyance object is accommodated, the hand comprises a protruded part in a pin shape which is contacted with a front end face of the conveyance object to correct a position of the conveyance object to be mounted on the hand when the conveyance object accommodated on a front side with respect to a normal accommodated position is to be carried out from the accommodation part at a time of actual use of the industrial robot, the positioning member is formed in a ring shape, and in the positioning member attaching step, an inner peripheral side of the positioning member is fitted to the protruded part and thereby the positioning member is attached to the upper face side of the hand.

2. The teaching method according to claim 1, wherein the conveyance object is formed in a circular plate shape, and in the positioning member attaching step, two pieces of the positioning member are attached to the upper face side of the hand.

* * * * *